(12) United States Patent
Xu et al.

(10) Patent No.: US 10,302,710 B2
(45) Date of Patent: May 28, 2019

(54) SYSTEM AND METHOD FOR ACTIVE BALANCING/CANCELLATION OF MAGNETIC INTERFERENCE IN A MAGNETIC SENSOR

(71) Applicant: Bourns, Inc., Riverside, CA (US)

(72) Inventors: Jian Xu, Windsor (CA); Aaron Seibold, Lake Orion, MI (US)

(73) Assignee: Bourns, Inc., Riverside, CA (US)

( * ) Notice: Subject to any disclaimer, the term of this patent is extended or adjusted under 35 U.S.C. 154(b) by 11 days.

(21) Appl. No.: 14/865,282

(22) Filed: Sep. 25, 2015

(65) Prior Publication Data

US 2016/0091574 A1    Mar. 31, 2016

Related U.S. Application Data (60) Provisional application No. 62/055,791, filed on Sep. 26, 2014.

(51) Int. Cl.
*G01D 5/12* (2006.01)
*G01R 33/02* (2006.01)
(Continued)

(52) U.S. Cl.
CPC ........... *G01R 33/0017* (2013.01); *G01D 5/12* (2013.01); *G01D 5/24428* (2013.01);
(Continued)

(58) Field of Classification Search
CPC .................. G01G 5/145; G01R 33/0017
(Continued)

(56) References Cited

U.S. PATENT DOCUMENTS 3,287,713 A    11/1966  Porter
4,983,915 A *  1/1991  Rossi ................... G01D 5/2033
                                                          324/173

(Continued)

FOREIGN PATENT DOCUMENTS

| CN | 203490330 U | 3/2014 |
| JP | S59142719 A | 8/1984 |
| WO | 2007060568 A2 | 5/2007 |

OTHER PUBLICATIONS

International Search Report and Written Opinion for Application No. PCT/US2015/052161 dated Dec. 11, 2015 (12 pages).

(Continued)

*Primary Examiner* — Reena Aurora
(74) *Attorney, Agent, or Firm* — Michael Best & Friedrich LLP (57) ABSTRACT

A sensing system including a first magnet having a first magnetic field. In one embodiment, the sensing system also includes a first stator configured to receive the first magnetic field and a second stator configured to receive the first magnetic field. A first collector is configured to collect the first magnetic field from the first stator, a second collector is configured to collect the first magnetic field from the second stator, and a magnetic sensing element is configured to sense the first magnetic field. The sensing system also includes a second magnet having a second magnetic field, and a third magnet having a third magnetic field. The third magnet is positioned such that the third magnetic field is symmetrical to the second magnetic field.

17 Claims, 7 Drawing Sheets

(51) Int. Cl.
   *G01R 33/00* (2006.01)
   *G01L 3/10* (2006.01)
   *G01R 33/025* (2006.01)
   *G01D 5/244* (2006.01)

(52) U.S. Cl.
   CPC .......... *G01L 3/101* (2013.01); *G01R 33/0076* (2013.01); *G01R 33/025* (2013.01)

(58) Field of Classification Search
   USPC .................................................... 324/207.12
   See application file for complete search history.

(56) References Cited

U.S. PATENT DOCUMENTS

| | | | |
|---|---|---|---|
| 7,726,208 B2 | 6/2010 | Hoeller et al. | |
| 8,333,259 B2* | 12/2012 | Matsuda | H02K 29/08 180/443 |
| 8,397,588 B2 | 3/2013 | Kang | |
| 8,592,777 B2 | 11/2013 | Kropp | |
| 2004/0061495 A1 | 4/2004 | Shimomura et al. | |
| 2005/0061089 A1 | 3/2005 | May | |
| 2007/0062312 A1 | 3/2007 | Cripe | |
| 2008/0246470 A1 | 10/2008 | Kahlman et al. | |
| 2009/0078058 A1* | 3/2009 | Aoki | G01L 5/221 73/862.335 |
| 2009/0184706 A1 | 7/2009 | Duric et al. | |
| 2010/0147620 A1 | 6/2010 | Ishihara et al. | |
| 2010/0176807 A1 | 7/2010 | Duric et al. | |
| 2010/0242627 A1 | 9/2010 | Okuyama et al. | |
| 2012/0060628 A1 | 3/2012 | Sanada et al. | |
| 2012/0153946 A1 | 6/2012 | van Veldhoven | |
| 2013/0133437 A1 | 5/2013 | Woo | |
| 2013/0181702 A1 | 7/2013 | May | |
| 2013/0312539 A1 | 11/2013 | Shimomura et al. | |
| 2015/0330849 A1 | 11/2015 | Matsui et al. | |

OTHER PUBLICATIONS

Paperno et al., "Compensation of Crosstalk in Three-Axial Induction Magnetometers", IEEE Transactions on Instrumentation and Measurement, Oct. 2011, pp. 3416-3422, vol. 60, No. 10, Department of Electrical and Computer Engineering, Ben-Gurion University of the Negev, Beer-Sheva, Israel.

Zhang et al., "High Performance Three-axis Actuator in Super-multi Optical Pickup with Low Crosstalk Force", IEEE Transactions on Consumer Electronics, Nov. 2008, pp. 1743-1749, vol. 54, No. 4, Optical Memory National Engineering Research Center, Tsinghua University, Beijing, China.

Woo et al., "Optimal Design of a Ferromagnetic Yoke for Reducing Crosstalk in Optical Image Stabilization Actuators", IEEE Transactions on Magnetics, Oct. 2011, pp. 4298-4301, vol. 47, No. 10, School of Mechanical Engineering, Yonsei University, Seoul, Korea, Hanhwa Corporation, Daejeon, Korea.

International Preliminary Report on Patentability for Application No. PCT/US2015/052161 dated Apr. 20, 2017 (9 pages).

Extended European Search Report and Search Opinion for Application No. 15844184.0 dated Apr. 16, 2018 (9 pages).

Chinese Patent Office Action for Application No. 201580049666.9 dated Dec. 5, 2018 (16 pages, English translation included).

\* cited by examiner

SYSTEM AND METHOD FOR ACTIVE BALANCING/CANCELLATION OF MAGNETIC INTERFERENCE IN A MAGNETIC SENSOR

CROSS-REFERENCE TO RELATED CASES

This application claims the benefit to U.S. Provisional Application No. 62/055,791, filed on Sep. 26, 2014, the entire contents of which are incorporated herein by reference.

BACKGROUND

Embodiments of the invention relate to balancing and/or cancelling of magnetic interference in a magnetic sensor, specifically a torque and/or angle sensor or a torque and/or index sensor.

Torque and angle sensors typically include a magnetic sensing element. The magnetic sensing elements usually include a magnet or other magnetic component. Often the magnet from one of the sensors interferes with the sensing elements from the other sensor. This interference is referred to as "cross-talk." Among other things, cross-talk can lead to incorrect sensor readings.

To reduce cross-talk, the distance between the two sensors can be physically increased, or magnetic shielding can be used in either or both sensors. Both of these solutions result in a bulky/large sensor package or inferior sensor performance.

SUMMARY

Embodiments of the invention helps solve or reduce the impact of these problems by providing, in one example, a sensing system that includes a first magnet having a first magnetic field. The sensing system also includes a first stator configured to receive the first magnetic field; a second stator configured to receive the first magnetic field; a first collector configured to collect the first magnetic field from the first stator; and a second collector configured to collect the first magnetic field from the second stator. A magnetic sensing element is configured to sense the first magnetic field. The sensing system also includes a second magnet having a second magnetic field; and a third magnet having a third magnetic field. The third magnet is positioned such that the third magnetic field is symmetrical to the second magnetic field.

In another embodiment the invention provides a method of sensing a magnetic field of a magnetic sensor. The magnetic sensor includes a first magnet having a first magnetic field, a first stator configured to receive the first magnetic field, a second stator configured to receive the first magnetic field. The magnetic sensor further includes a first collector configured to collect the first magnetic field from the first stator, and a second collector configured to collect the first magnetic field from the second stator. The method of sensing the magnetic field includes receiving a second magnetic field from a second magnet and positioning a third magnet having a third magnetic field such that the third magnetic field is symmetrical to the second magnetic field.

In yet another embodiment, the invention provides a sensing system including a first magnetic sensor. The first magnetic sensor includes a first magnet having a first magnetic field, a first stator configured to receive the first magnetic field, a second stator configured to receive the first magnetic field, a first collector configured to collect the first magnetic field from the first stator, a second collector configured to collect the first magnetic field from the second stator, and a magnetic sensing element configured to sense the first magnetic field. The sensing system further includes a second magnet having a second magnetic field, the second magnet positioned such that the first stator and the second stator receive a substantially similar amount of the second magnetic field.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
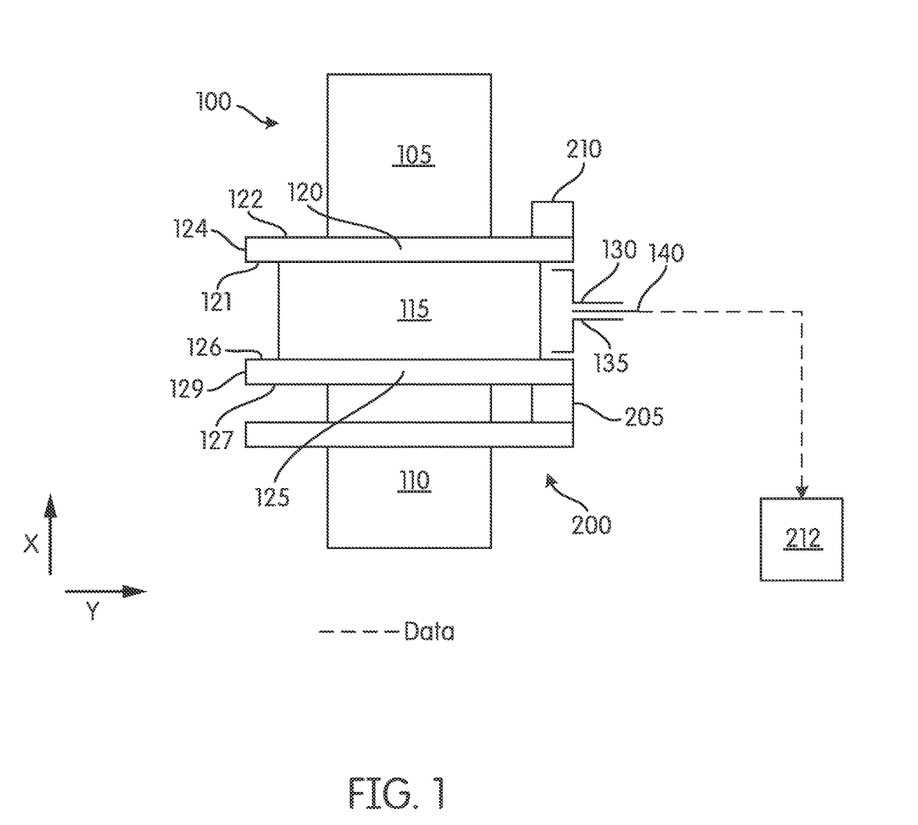
FIG. 1 is a cross-sectional, schematic view of a sensor according to a first embodiment of the invention.

FIG. 1 illustrates a first sensor 100 according to one embodiment. In the embodiment illustrated, the first sensor 100 is used in connection with a vehicle steering system that includes an input shaft 105 and an output shaft 110. The input shaft 105 and the output shaft 110 are connected via a torsion bar (not shown). The torsion bar has a torsional rigidity or torsion spring constant of a predetermined or known amount. Rotational motion of the input shaft 105 relative to the output shaft 110 produces a relative angular displacement between the input shaft 105 and the output shaft 110 proportional to the torque exerted. In some embodiments, the first sensor 100 detects, or senses, a torque and/or a steering angle between the input shaft 105 and the output shaft 110.

The sensor 100 includes a first magnet 115 coupled to the input shaft 105, and first and second stators 120 and 125 coupled to the output shaft 110. In other embodiments, the first magnet 115 is coupled to the output shaft 110, while the first stator 120 and the second stator 125 are coupled to the input shaft 105.

The sensor 100 also includes a first collector 130 and a second collector 135. The first collector 130 and second collector 135 are located proximate to (for example, in one embodiment, within a distance of about 0.2 mm to about 2.0 mm) the first stator 120 and the second stator 125, respectively. The first and second collectors 130 and 135 span across at least a portion of the first stator 120 and the second stator 125, respectively.

The first collector 130 and the second collector 135 are magnetically coupled to at least one magnetic sensing element 140. The term "magnetically coupled" may, in general, be defined as magnetic communication between a first component and a second component, such that the first component is able to receive a magnetic flux from the second component, or vice versa. Such communication is dependent on the strength of the magnets used and the distances between components. In some embodiments, in order to be magnetically coupled, the first component is a distance of approximately 0.2 mm to 2.0 mm from the second component. The magnetic sensing element 140 detects a first magnetic flux 300 (FIG. 3) of the first magnet 115 between, or near to, the first collector 130 and the second collector 135. In some embodiments, the magnetic sensing element 140 is a Hall-effect sensor.

FIG. 1 also illustrates a second magnetic sensor 200. The second sensor 200 is located proximate the first sensor 100 and includes a second magnet 205. In some embodiments, the second sensor 200 also includes third and fourth stators, third and fourth collectors, and a second magnetic sensing element. In such an embodiment, the third and fourth stators, third and fourth collectors, and the second magnetic sensing element are substantially similar to the first and second stators 120, 125, the first and second collectors 130, 135, and the magnetic sensing element 140. In some embodiments the first sensor 100 and the second sensor 200 are both part of a larger sensor or a sensor assembly, such as a rotation angle and torque sensor. In some embodiments, the first sensor 100 may be a torque sensor while the second sensor 200 may be a rotational sensor, or vice-versa.

In the illustrated embodiment, the first sensor 100 includes a third magnet, or mirror magnet, 210. As illustrated, the mirror magnet 210 is positioned symmetrical to the second magnet 205, such that a mirror magnetic flux 275 (FIG. 3) of the mirror magnet 210 is symmetrical to a second magnetic flux 250 (FIG. 3) of the second magnet 205 of the second sensor 200. In some embodiments, the mirror magnet 210 is further used within a third sensor, which may or may not be part of the overall sensor. In other embodiments, the mirror magnet 210 is used solely to cancel out the second magnetic flux 250 of the second magnet 205.

The first stator 120 includes a first side 121, a second side 122, and a first periphery 124. The second stator 125 includes a first side 126, a second side 127, and a second periphery 129. As illustrated in the embodiment of FIG. 1, the first magnet 115 is positioned adjacent the first side 121 of the first stator 120 and the first side 126 of the second stator 125. Additionally, as illustrated, the first magnet 115 is positioned between the first stator 120 and the second stator 125, in an axial direction running parallel to the x-axis in the reference coordinate system shown. In some embodiments, such as the embodiment illustrated, the first magnet 115 is positioned between a first surface of the second side 122 of the first stator 120 and a second surface of the second side 127 of the second stator 125, in the axial direction. The second magnet 205 is positioned adjacent the second side 127 of the second stator 125 and the mirror magnet 210 is positioned adjacent the second side 122 of the first stator 120.

Figure 2:
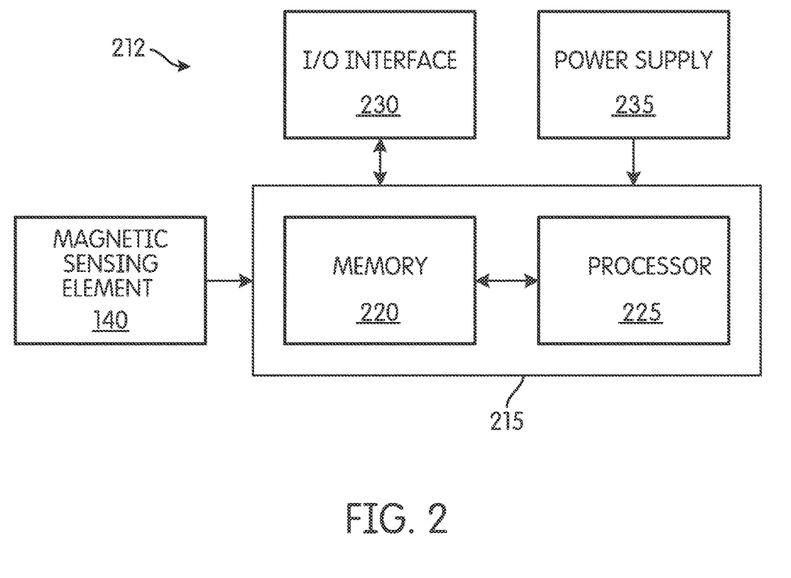
FIG. 2 is a block diagram of a control system for use and in communication with the sensor of FIG. 1.

The magnetic sensing element 140 is electrically coupled to a control system 212 (FIG. 2). As illustrated in FIG. 2, the control system 212 includes a controller 215 having a memory 220 and a processor 225. The controller 215 receives a signal from the magnetic sensing element 140 concerning a first magnetic flux 300 of the first magnet 115. The signal may include information or data regarding the magnitude and/or the polarity of the magnetic flux. The signal may be an analog or digital signal. In some embodiments, the signal provides information related to a change in the magnetic flux. As illustrated, in some embodiments the controller 215 may be electrically connected to an input/output (I/O) interface 230 and a power supply 235. In some embodiments, the controller 215 may further be electrically connected to the second sensor 200. In some embodiments, the controller 215 is implemented partially or entirely on a semiconductor chip.

The memory 220 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processor 225 is connected to the memory 220 and executes software instructions. Software included in the implementation of the sensor 100 and/or controller 215 can be stored in the memory 220 of the controller 215. The software includes, for example, firmware, one or more applications, program data, filters, rules, one or more program modules, and other executable instructions. The controller 215 is configured to retrieve from memory 220 and execute, among other things, instructions related to the control processes and methods described herein. In other constructions, the controller 215 includes additional, fewer, or different components.

The I/O interface 230 is configured to connect the controller 215 to a peripheral device, such as, for example, another controller or computer. The I/O interface 230 may be a wired connection, a wireless connection, or a combination of wired and wireless connections. In some embodiments, the I/O interface 230 is configured to communicate measurement data associated with the sensor 100. In some embodiments, the I/O interface 230 is used to electrically connect the controller 215 to a user-interface. The power supply 235 supplies a nominal voltage to the controller 215, as well as other components of the sensor 100. In some embodiments, the power supply 235 is powered by a first voltage (e.g., from a battery) and provides the nominal voltage to the controller 215 and other components of the sensor 100.

Figure 3:
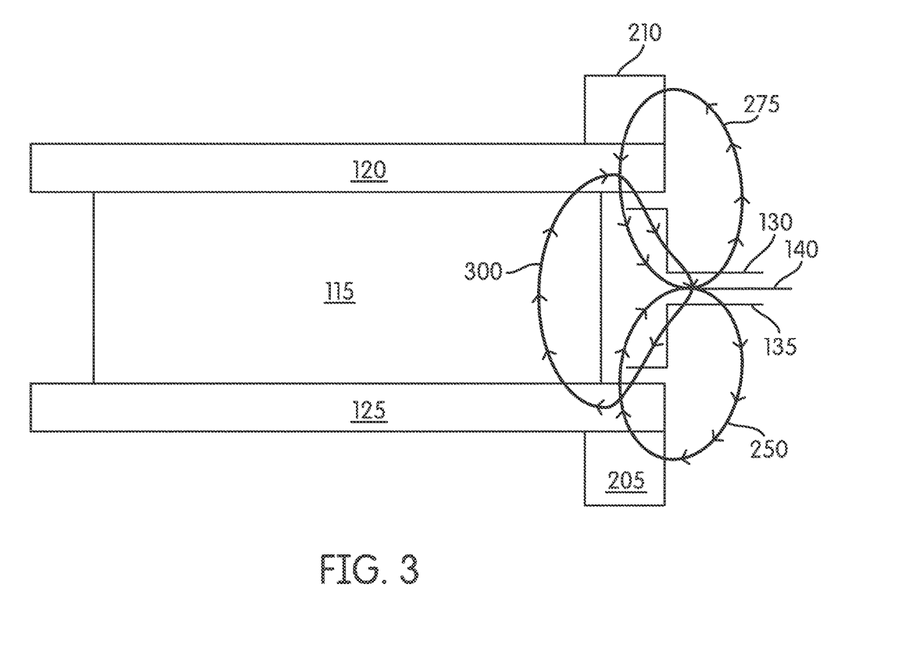
FIG. 3 is a cross-sectional, schematic view of a portion of the sensor of FIG. 1 and illustrates certain magnetic flux lines.

FIG. 3 illustrates a second magnetic flux 250 of the second magnet 205 and a third, or mirror, magnetic flux 275 of the mirror magnet 210. As is known in the art, a magnet generates a magnetic field, which may be illustrated by magnetic flux, or magnetic flux lines. As illustrated in FIG. 3, the mirror magnetic flux 275 is symmetrical to the second magnetic flux 250. Therefore, the second magnetic flux 250 and the mirror magnetic flux 275 cancel each other out. As a consequence, the only flux that affects the sensing element is the first magnetic flux 300. Said in other words, the magnetic sensing element 140 detects only the first magnetic flux 300. Of course, if the symmetry is less than ideal a small or nominal amount of interference from the second and/or third magnets will occur.

In operation, when torque is exerted on the system, the torsion bar (not shown) regulates the relative angular displacement between the input shaft 105 and the output shaft 110. The relative angular displacement of the input shaft 105 and the output shaft 110 is equivalent to the angular displacement between the magnet 115 (which is coupled to the input shaft 105) and the first and second stators 120 and 125 (which are coupled to the output shaft 110). A zero position of the system is the position where there is zero or no torque exerted on the system and zero angular displacement between the magnet 115 and first and second stators 120 and 125. At the zero position, the magnet 115 and first and second stators 120 and 125 produce a net zero magnetic flux of the magnetic field or a net zero axial magnetic flux of the magnetic field.

When torque is exerted on the system, there is an angular displacement between the magnet 115 and the first and second stators 120 and 125. The angular displacement between the magnet 115 and the first and second stators 120 and 125 results in a change of the first magnetic flux 300 (e.g., a change in the magnitude and/or polarity of the magnetic flux of the magnetic field). The greater the angular displacement, the greater the magnetic flux. A first angular displacement in a first rotational direction causes the first magnetic flux 300 to have a first direction, while a second angular displacement in a second rotational direction causes the first magnetic flux 300 to have a second direction, opposite the first direction.

Figure 4:
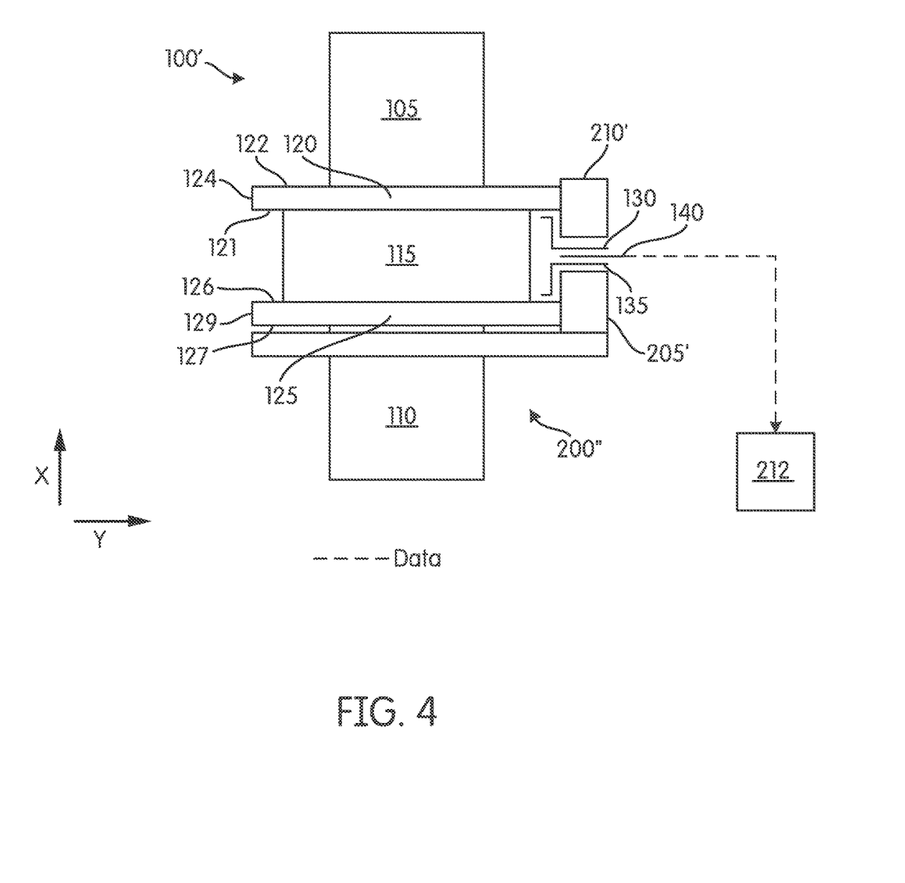
FIG. 4 is a cross-sectional, schematic view of a sensor according to another embodiment of the invention.

FIG. 4 illustrates a second embodiment of a first sensor 100' located proximate a second sensor 200' having a second magnet 205'. In the illustrated embodiment, a mirror magnet 210' is positioned such that the mirror magnetic flux 275' (FIG. 5) of the mirror magnet 210' is symmetrical to the second magnetic flux 250' (FIG. 5) of the second magnet 205'

As illustrated in the embodiment of FIG. 4, the first magnet 115 is positioned adjacent the first side 121 of the first stator 120 and adjacent the first side 126 of the second stator 125. As illustrated, the first magnet 115 is aligned axially with the x axis of the coordinate system shown and is positioned between the first stator 120 and the second stator 125. The second magnet 205' is positioned adjacent the second periphery 129 of the second stator 125 and the mirror magnet 210 is positioned adjacent the first periphery 124 of the first stator 120. Additionally, the second magnet 205' and the mirror magnet 210' are aligned radially with respect to the longitudinal axis of the sensor 100'.

Figure 5:
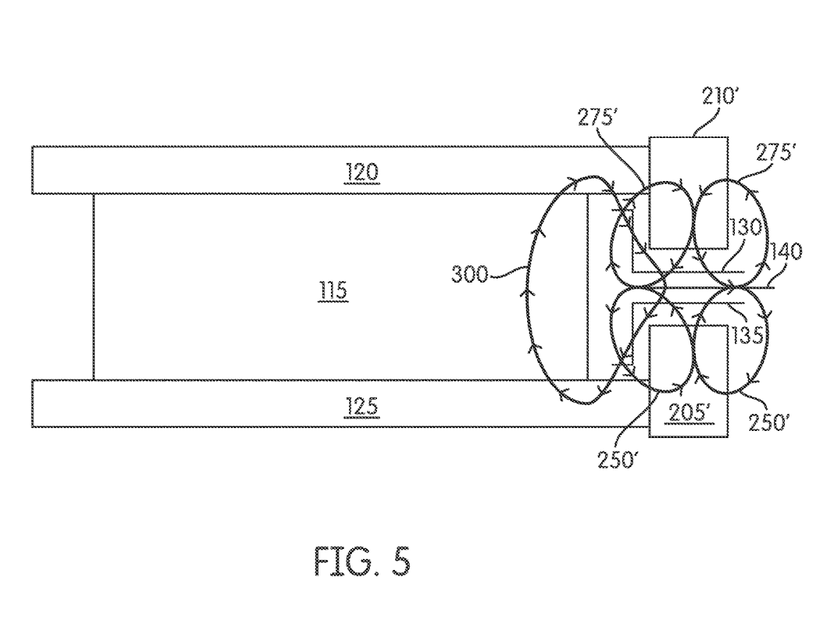
FIG. 5 is a cross-sectional, view schematic of a portion of the sensor of FIG. 4 and illustrates certain magnetic flux lines.

FIG. 5 illustrates a second magnetic flux 250' of the second magnet 205' and a third, or mirror, magnetic flux 275' of the mirror magnet 210'. As illustrated, the mirror magnetic flux 275' is symmetrical to the second magnetic flux 250'. Therefore, the second magnetic flux 250' and the mirror magnetic flux 275' cancel each other out. Thus, the magnetic sensing element 140 detects only the first magnetic flux 300.

Figure 6:
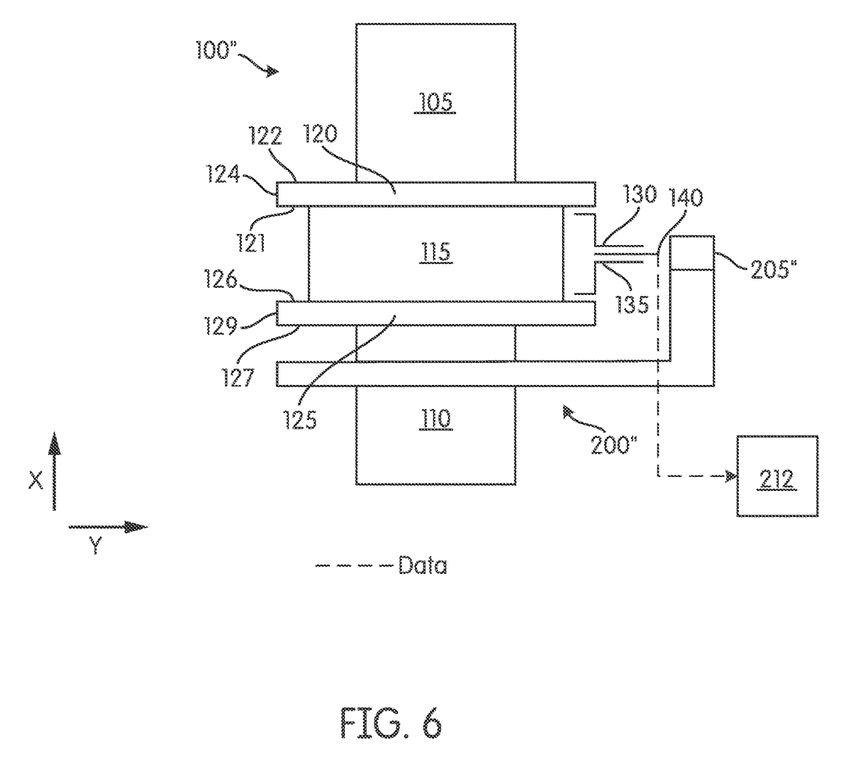
FIG. 6 is a cross-sectional schematic view of a sensor according to another embodiment of the invention.
Figure 7:
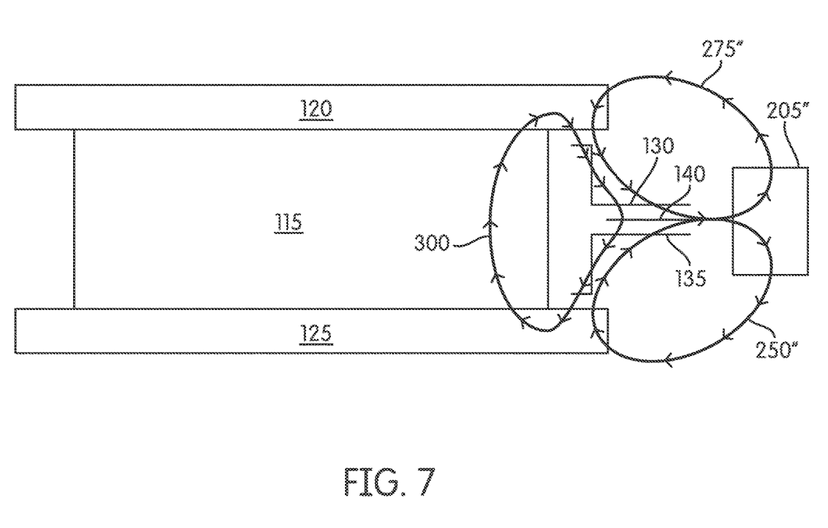
FIG. 7 is a cross-sectional schematic view of a portion of the sensor of FIG. 6, further including magnetic flux lines.

FIG. 6 illustrates a third embodiment of a first sensor 100" located proximate a second sensor 200" having a second magnet 205". In this case, the second magnet 205" is magnetized in such a way that the resulting field is symmetric about the longitudinal axis of the sensor 100". In this embodiment, the second magnet 205" is positioned substantially equal distances from the first stator and second stator 120, 125 of the first sensor 100". Such a positioning of the second magnet 205" results in a second magnetic flux 250" (FIG. 7) which is symmetrical to the first and second stators 120, 125 and the first and second collectors 130, 135, such that the first and second stators 120, 125 and the first and second collectors 130, 135 receive approximately the same magnetic flux. Therefore, the magnetic sensing element 140 detects only the first magnetic flux 300. As illustrated, the second magnet 205" is radially separated from the first and second stators 120, 125.

Thus, the invention provides, among other things, a system and method for balancing and/or cancelling magnetic interference in a magnetic sensor, specifically a torque and/or angle sensor. Various features and advantages of the invention are set forth in the following claims.

What is claimed is:

1. A sensing system comprising:
   a first magnetic sensor configured to detect a first characteristic based on a first magnetic field, the first magnetic sensor including
      a first magnet having the first magnetic field,
      a first stator proximate the first magnet, the first stator configured to receive the first magnetic field,
      a second stator proximate the first magnet, the second stator configured to receive the first magnetic field,
      a first collector proximate the first stator, the first collector configured to collect the first magnetic field from the first stator,
      a second collector proximate the second stator, the second collector configured to collect the first magnetic field from the second stator, and
      a magnetic sensing element proximate the first and second stators, the first magnetic sensing element configured to sense the first magnetic field;
   a second magnetic sensor proximate the first magnetic sensor, the second magnetic sensor configured to detect a second characteristic based on a second magnetic field, the second magnetic sensor including a second magnet having the second magnetic field; and
   a third magnet having a third magnetic field, the third magnet positioned such that the third magnetic field is symmetrical to the second magnetic field.

2. The sensing system of claim 1, wherein the third magnetic field substantially cancels the second magnetic field at the location of the magnetic sensing element.

3. The sensing system of claim 1, further comprising an input shaft coupled to the first magnet and an output shaft coupled to the first stator and the second stator.

4. The sensing system of claim 3, wherein at least one selected from a group consisting of the first characteristic and the second characteristic is a torque between the input shaft and the output shaft.

5. The sensing system of claim 3, wherein at least one selected from a group consisting of the first characteristic and the second characteristic is a relative position between the input shaft and the output shaft.

6. The sensing system of claim 1, wherein the first magnet is located adjacent a first side of the first stator and a first side of the second stator, the second magnet is located adjacent a second side of the first stator, and the third magnet is located adjacent a second side of the second stator.

7. The sensing system of claim 1, wherein the first magnet is located axially between the surface of the first stator furthest from the second stator and the surface of the second stator furthest from the first stator in an axial direction.

8. The sensing system of claim 7, wherein the second magnet is located adjacent a periphery of the second stator in a radial direction, and the third magnet is located adjacent a periphery of the first stator in the radial direction.

9. A sensing system comprising:
   a first magnetic sensor configured to detect a first characteristic based on a first magnetic field, the first magnetic sensor including
      a first magnet having the first magnetic field, a first stator located proximate the first magnet, the first stator configured to receive the first magnetic field, a second stator located proximate the first magnet, the second stator configured to receive the first magnetic field, a first collector located proximate the first stator, the first collector configured to collect the first magnetic field from the first stator, a second collector located proximate the second stator, the second collector configured to collect the first magnetic field from the second stator, and a magnetic sensing element configured to sense the first magnetic field; and a second magnetic sensor configured to detect a second characteristic based on a second magnetic field, the second magnetic sensor including a second magnet having the second magnetic field, the second magnet positioned such that the first stator and the second stator receive a substantially similar amount of the second magnetic field.

10. The sensing system of claim 9, wherein at least one selected from a group consisting of the first characteristic and the second characteristic is at least one selected from the group consisting of a torque and a relative position between an input shaft and an output shaft.

11. A method of sensing a magnetic field of a sensing system, the method comprising providing a first magnetic field with a first magnet;

receiving at least a portion of the first magnetic field with a first stator located proximate the first magnet;

receiving at least a portion of the first magnetic field with a second stator located proximate the first magnet;

collecting at least a portion of the first magnetic field from the first stator with a first collector located proximate the first stator;

collecting at least a portion of the first magnetic field from the second stator with a second collector proximate the second stator;

determining, via an electronic controller, a first characteristic, the first characteristic based on the portion of the first magnetic field;

receiving a second magnetic field from a second magnet;

determining, via the electronic controller, a second characteristic, the second characteristic based on at least a portion of the second magnetic field; and positioning a third magnet having a third magnetic field such that the third magnetic field is symmetrical to the second magnetic field.

12. The method of claim 11, wherein the step of positioning the third magnet includes the third magnetic field cancelling out the second magnetic field at the magnetic sensing element.

13. The method of claim 11, further comprising positioning the first magnet at a first location adjacent a first side of the first stator and a first side of the second stator;

positioning the second magnet at a second location adjacent a second side of the first stator; and positioning the third magnet at a third location adjacent a second side of the second stator.

14. The method of claim 11, further comprising positioning the first magnet axially between the surface of the first stator furthest from the second stator and the surface of the second stator furthest from the first stator in an axial direction.

15. The method of claim 14, further comprising positioning the second magnet at a second location adjacent a periphery of the second stator in a radial direction; and positioning the third magnet at a third location adjacent a periphery of the first stator in the radial direction.

16. The method of claim 11, wherein at least one selected from a group consisting of the first characteristic and the second characteristic is a torque.

17. The method of claim 11, wherein at least one selected from a group consisting of the first characteristic and the second characteristic is a relative position between an input shaft and an output shaft.

* * * * *